United States Patent
Oike et al.

(10) Patent No.: US 8,097,885 B2
(45) Date of Patent: Jan. 17, 2012

(54) COMPOUND SEMICONDUCTOR FILM, LIGHT EMITTING FILM, AND MANUFACTURING METHOD THEREOF

(75) Inventors: Tomoyuki Oike, Yokohama (JP); Tatsuya Iwasaki, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 594 days.

(21) Appl. No.: 12/127,766

(22) Filed: May 27, 2008

(65) Prior Publication Data

US 2008/0303035 A1 Dec. 11, 2008

(30) Foreign Application Priority Data

Jun. 11, 2007 (JP) ................................. 2007-154035

(51) Int. Cl.
*H01L 29/15* (2006.01)
(52) U.S. Cl. ................. 257/76; 257/43; 257/78; 257/94; 257/98; 257/99; 257/102; 257/103; 257/613; 257/614; 257/616; 257/744; 257/E33.013; 257/E33.019; 257/E33.037; 257/E33.039
(58) Field of Classification Search .................... 257/43, 257/76, 78, 94, 98, 99, 102, 103, 613, 614, 257/616, 744, E33.013, E33.019, E33.037, 257/E33.039
See application file for complete search history.

(56) References Cited

U.S. PATENT DOCUMENTS

| | | | |
|---|---|---|---|
| 6,476,409 B2 | 11/2002 | Iwasaki et al. | |
| 6,784,007 B2 | 8/2004 | Iwasaki et al. | |
| 7,319,069 B2 | 1/2008 | Den et al. | |
| 2007/0047037 A1 | 3/2007 | Yoshizawa et al. | |
| 2007/0063211 A1 | 3/2007 | Iwasaki | |
| 2008/0073653 A1 | 3/2008 | Iwasaki | |

FOREIGN PATENT DOCUMENTS

| | | |
|---|---|---|
| JP | 8102546 | 4/1996 |
| JP | 8204240 | 8/1996 |
| JP | 2007018891 | 1/2007 |
| JP | 2007058129 | 3/2007 |

OTHER PUBLICATIONS

Yao et al., Preparation and characterization of the quaternary chalcogenides Cu2B(II)C(IV)X4 [B(II) = Zn, Cd; C(IV) = Si, Ge; X = S, Se], Solid State Ionics 24 (1987) pp. 249-252 (Abstract only).*
Kobayashi, et al., "DC Green Electroluminescence of A1-CuGaS2 Diode", Jpn. J. Appl. Phys., vol. 31 (1992), pp. L 1606-L 1608, Pt. 2, No. 11B, Nov. 15, 1992.

(Continued)

*Primary Examiner* — Jay C Kim
(74) *Attorney, Agent, or Firm* — Fitzpatrick, Cella, Harper & Scinto

(57) ABSTRACT

Provided are a compound semiconductor film which is manufactured at a low temperature and exhibits excellent p-type conductivity, and a light emitting film in which the compound semiconductor film and a light emitting material are laminated and with which high-intensity light emission can be realized. The compound semiconductor film has a composition represented by a $Cu_2$—$Zn$—$IV$—$S_4$ type, in which the IV is at least one of Ge and Si. The light emitting film includes the light emitting material and the compound semiconductor film laminated on a substrate in the stated order.

8 Claims, 2 Drawing Sheets

OTHER PUBLICATIONS

Chichibu, et al., "Fabrication of p-CuGaS2/n-ZnO:Al heterojunction light-emitting diode grown by metalorganic vapor phase epitaxy and helicon-wave-excited-plasma sputtering methods", Journal of Physics and Chemistry of Solids 66 (2005) pp. 1868-1871.

Matsushita, et al., "Structural, thermodynamical and optical properties of Cu2-II-IV-VI4 quaternary compounds", Journal of Materials Science, vol. 40, (2005) pp. 2003-2005.

Seol, et al., "Electrical and optical properties of Cu2ZnSnS4 thin films prepared by rf magnetron sputtering process", Solar Energy Materials & Solar Cells, vol. 75, (2003), pp. 155-162.

U.S. Appl. No. 11/993,456, international filing date Sep. 5, 2006, Iwasaki, T.

* cited by examiner

| MULTI-ELEMENT COMPOUND SEMICONDUCTOR | CRYSTAL STRUCTURE | CRYSTAL SYSTEM | Eg [eV] |
|---|---|---|---|
| $Cu_2ZnSnS_4$ | stannite | TETRAGONAL | 1.39 |
| $Cu_2ZnGeS_4$ | wurtz-stannite | ORTHORHOMBIC | 2.10 |
| $Cu_2ZnSiS_4$ | wurtz-stannite | ORTHORHOMBIC | 3.25 |

US 8,097,885 B2

COMPOUND SEMICONDUCTOR FILM, LIGHT EMITTING FILM, AND MANUFACTURING METHOD THEREOF

BACKGROUND OF THE INVENTION

1. Field of the Invention

The present invention relates to a compound semiconductor film, a light emitting film, a manufacturing method thereof.

2. Description of the Related Art

Various materials of a compound semiconductor containing three or more constituent elements (multi-element compound semiconductor) have been known up to now. The synthesis of the compound semiconductor, the production of a single crystal thereof, and the measurement of various physical properties thereof have been done. In recent years, in order to apply the compound semiconductor to devices, thin film technologies have been under active research. This greatly depends on the improvement of controllability of a thin film composition resulting from advances of thin film forming methods and apparatus technologies and on the advances of analysis methods and analysis technologies for formed thin films. An example of the devices developed under such circumstances is a thin film solar battery technology as disclosed in Japanese Patent Application Laid-Open No. H08-102546.

When a compound semiconductor film is used to manufacture a device, a manufacturing temperature of the device becomes a problem. When the manufacturing temperature is too high, not only a substrate material and films to be laminated are limited but also a special manufacturing apparatus and a special treatment apparatus are required.

In recent years, light emitting devices with high-intensity light emission have been under active development. The advance of technical development for an LED, an LD, an inorganic EL device, and an organic EL device is remarkable. In the case of the LED and the LD, electrons and holes are injected to the pn-junction of a semiconductor having a high-quality crystal structure to cause recombination light emission. In the case of the inorganic EL device, a high electric field is applied to an insulating phosphor thin film to cause light emission by electric field excitation of the light emission center of the phosphor thin film due to hot electrons. In the case of the organic EL device, a light emitting layer, an electron transporting layer, and a hole transporting layer, which are comprised of organic molecules or is a polymer thin film, are laminated. The light emission of excitons localized on the organic molecules is caused with recombination energy of the injected electrons and holes.

A MIS diode structure made of Al/ZnS/CuGaS$_2$, serving as a direct current driven light emitting device using a chalcopyrite compound semiconductor, is disclosed in "Japanese Journal of Applied Physics 31, L1606, 1992". According to this diode structure, electrons are injected through a Schottky barrier between a metal layer and an insulating layer, so green light, albeit weak, is emitted from a semiconductor layer. A structure is disclosed in "Journal of Physics and Chemistry of Solids 66, 1868-2005", in which a heterojunction diode is obtained by laminating a p-type CuGaS$_2$ chalcopyrite compound semiconductor layer and an n-type ZnO:Al compound semiconductor layer and is sandwiched between metals having different work functions. Attempts have been made to apply this structure to the direct current driven light emitting device. However, only weak light can be emitted at present.

The chalcopyrite compound semiconductor employed in the above structures is manufactured using an advanced manufacturing method such as a single crystal manufacturing method or an organic metal vapor phase epitaxy method, because higher p-type conductivity is required. It is necessary to manufacture the chalcopyrite compound semiconductor employed in the above structures at a temperature higher than 600° C.

A compound semiconductor which is represented by a Cu$_2$—Zn—IV—S$_4$ type (the Group IV element is selected from the group consisting of Sn, Ge, and Si) is disclosed in "Journal of Materials Science 40 (2005) 2003-2005" and the crystal structure and band gap (Eg) thereof are described as illustrated in FIG. 5. However, no description is found on the electrically conductive property. According to the description of "Solar Energy Materials & Solar Cells 75 (2003) 155-160", a compound semiconductor of Cu$_2$ZnSnS$_4$ (Eg=1.39 eV) can be manufactured at a temperature of approximately 400° C. to 550° C. and exhibits p-type conductivity.

However, the compound semiconductor films of the above-described do not exhibit sufficient p-type conductivity. The manufacturing temperatures of the compound semiconductor films are high. Light emitting devices using the compound semiconductor films cannot obtain high intensity and may emit light only at a low temperature such as a liquid nitrogen temperature or a liquid helium temperature. It is known that the compound semiconductor of Cu$_2$ZnSnS$_4$ (Eg=1.39 eV) can be manufactured at the temperature of approximately 400° C. to 550° C. and exhibits the p-type conductivity, but the band gap thereof is narrower than an energy region of visible light. Therefore, when the compound semiconductor is laminated together with a light emitting material, light emitted from the light emitting material may be absorbed thereby.

SUMMARY OF THE INVENTION

The present invention has been made in view of the problems described above. An object of the present invention is to provide a compound semiconductor film which is manufactured at a low temperature and exhibits excellent p-type conductivity. Another object of the present invention is to provide a light emitting film in which the compound semiconductor film and a light emitting material are laminated and high-intensity light emission can be realized.

According to an aspect of the present invention, there is provided a compound semiconductor film having a composition represented by a Cu$_2$—Zn—IV—S$_4$ type, in which the IV is at least one of Ge and Si.

According to the present invention, there is provided a light emitting film including at least a light emitting material and a compound semiconductor film laminated on a substrate in the stated order. The compound semiconductor film includes a compound semiconductor having a composition represented by a Cu$_2$—Zn—IV—S$_4$ type in which the IV is at least one of Ge and Si.

Further, according to another aspect of the present invention, there is provided a compound semiconductor film manufacturing method, including depositing a compound semiconductor film on a base, in which the compound semiconductor film is a semiconductor represented by a Cu$_2$—Zn—IV—S$_4$ type where the IV is at least one of Ge and Si; and the depositing process includes at least one of forming the compound semiconductor film at a temperature which is equal to or higher than 400° C. and lower than 600° C. and performing heat treatment on the compound semiconductor film at said temperature.

Still further, according to another aspect of the present invention, there is provided a light emitting film manufacturing method, including laminating at least a light emitting material and a compound semiconductor film on a substrate in the stated order, in which the compound semiconductor film is a semiconductor represented by a $Cu_2$—Zn—IV—$S_4$ type where the IV is at least one of Ge and Si; and when the light emitting material and the compound semiconductor film are laminated, one of a temperature of the substrate and a heat treatment temperature is held at a temperature which is equal to or higher than 400° C. and lower than 600° C.

According to the present invention, it is possible to obtain the compound semiconductor film which is manufactured at a low temperature and has excellent p-type conductivity. In addition, it is possible to obtain the light emitting film in which the light emitting material and the compound semiconductor film are laminated in the stated order. Therefore, high-intensity light emission can be effectively extracted from the light emitting film to the outside.

Further features of the present invention will become apparent from the following description of exemplary embodiments with reference to the attached drawings.

BRIEF DESCRIPTION OF THE DRAWINGS

FIG. 3 is a schematic cross sectional view illustrating a compound semiconductor film according to the embodiment of the present invention.

FIG. 4 a schematic cross sectional view illustrating a light emitting device corresponding to a comparative example of the light emitting device illustrated in FIG. 2.

FIG. 5 is a table illustrating crystal structures of compound semiconductors and band gaps thereof.

DESCRIPTION OF THE EMBODIMENT

Hereinafter, a compound semiconductor film and a light emitting film according to an embodiment of the present invention will be described in detail with reference to the attached drawings.

Figure 1:
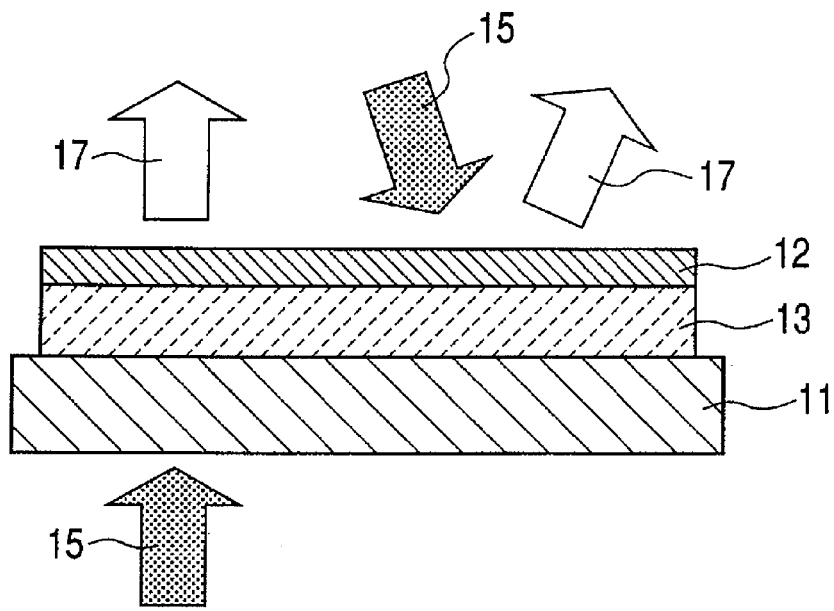
FIG. 1 is a schematic cross sectional view illustrating a light emitting film according to an embodiment of the present invention.

FIG. 1 is a schematic cross sectional view illustrating a structure of a light emitting film according to the embodiment of the present invention. The light emitting film according to this embodiment includes a light emitting material 13 and a compound semiconductor film 12 which are successively laminated on a substrate 11.

A compound semiconductor used in the present invention is represented by a $Cu_2$—Zn—IV—$S_4$ type. The $Cu_2$—Zn—IV—$S_4$ type means a compound semiconductor comprised of Cu, Zn, Group IV, and S in the periodic table of the elements. The compound semiconductor contains, as a main ingredient, a compound whose chemical composition ratio Cu:Zn:IV:S is 2:1:1:4. The compound semiconductor may contain a very small amount of impurity as a minor component. The compound semiconductor may have different crystalline and amorphous phases. The compound semiconductor film according to the present invention, which is a film of the compound semiconductor, has a chemical composition ratio close to the chemical composition ratio Cu:Zn:IV:S of 2:1:1:4. X-ray diffractometry using CuKα radiation is performed to obtain main peaks. When it is determined based on the main peaks that the compound semiconductor film includes many wurtz-stannite structures, the compound semiconductor film exhibits excellent p-type conductivity.

The semiconductor contains at least one of Ge and Si which is used as the element of Group IV. The band gap is larger than the light emission energy of the light emitting film or a light emitting device using the light emitting film. That is, in the case of a crystal structure of $Cu_2ZnGeS_4$, the band gap (Eg) is equal to 2.10 eV. In the case of a crystal structure of $Cu_2ZnSiS_4$, Eg is equal to 3.25 eV. In the case of a crystal structure of $Cu_2Zn(Ge_{1-x}Si_x)S_4$, the band gap can be adjusted by changing the value of x between 0 and 1. When Sn is contained as the minor component, the band gap can also be adjusted. In this case, when the compound semiconductor is used for a light emitting film which emits light in a visible light region or a light emitting device using the light emitting film, a desirable band gap is equal to or larger than 1.5 eV (approximately 830 nm or less). The compound semiconductor described above can be manufactured at a temperature lower than the manufacturing temperature of the chalcopyrite compound semiconductor. Although it is difficult to obtain the p-type conductivity in a Group II-VI compound semiconductor, the compound semiconductor described above exhibits the p-type conductivity.

When at least the light emitting material and the compound semiconductor film described above are successively formed on the substrate, the light emitting film can be obtained.

Various light emitting materials can be used. In particular, it is desirable to use a donor-acceptor pair light emitting material which emits light by recombination of electrons and holes. This reason is that holes can be efficiently supplied from the p-type compound semiconductor according to the present invention.

The donor-acceptor pair light emitting material has respective energy levels produced by a donor and an acceptor which are added to a semiconductor which is a host material. Light is emitted by the recombination of electrons and holes which are trapped at the energy levels. For example, many semiconductors such as SiC (Group IV-IV), GaP, GaAs (Group III-V), ZnS, ZnSe, and CdS (Group II-VI) cause the light emission. In particular, the intensity of light emission caused by a deep donor-acceptor pair formed in a host material of a zinc sulfide (ZnS) compound is high even in a room. This donor-acceptor pair light emitting material is widely applied as a phosphor for a color television cathode ray tube or another phosphor. For example, there are a ZnS:Ag,Cl blue phosphor and a ZnS:Cu, Al green phosphor.

In the case of the donor-acceptor pair light emitting material in the present invention, ZnS (Eg=3.7 eV) which is a wide-gap semiconductor is used as the host material. Visible light can be emitted using this host material. Including an acceptor and a donor which are additional elements, it is represented as ZnS:A,D. The "A" (acceptor) is at least one selected from the group consisting of Au, Ag, Cu, and N. The "D" (donor) is at least one selected from the group consisting of Al, Ga, In, F, Cl, Br, and I. A light emission color is determined based on an energy difference between a produced donor level and a produced acceptor level. For example, in the case of ZnS:Cu,Al or ZnS:Cu,Ga, a light having a peak wavelength at approximately 2.4 eV is emitted. In the case of ZnS:Cu,Cl, a light having a peak wavelength at approximately 2.7 eV is emitted. In the case of ZnS:Ag,Al, a light having a peak wavelength at approximately 2.85 eV is emitted.

When the donor-acceptor pair light emitting material in which the additional elements are contained in the zinc sulfide compound and the $Cu_2$—Zn—IV—$S_4$ type compound semiconductor film described above are laminated to form a light emitting film, sulfur deficiency or oxidation can be prevented, so the number of defects included in the light emitting material becomes smaller. Therefore, the injection level of carriers is improved, with the result that a light emitting film capable of emitting higher-intensity light can be obtained.

Figure 2:
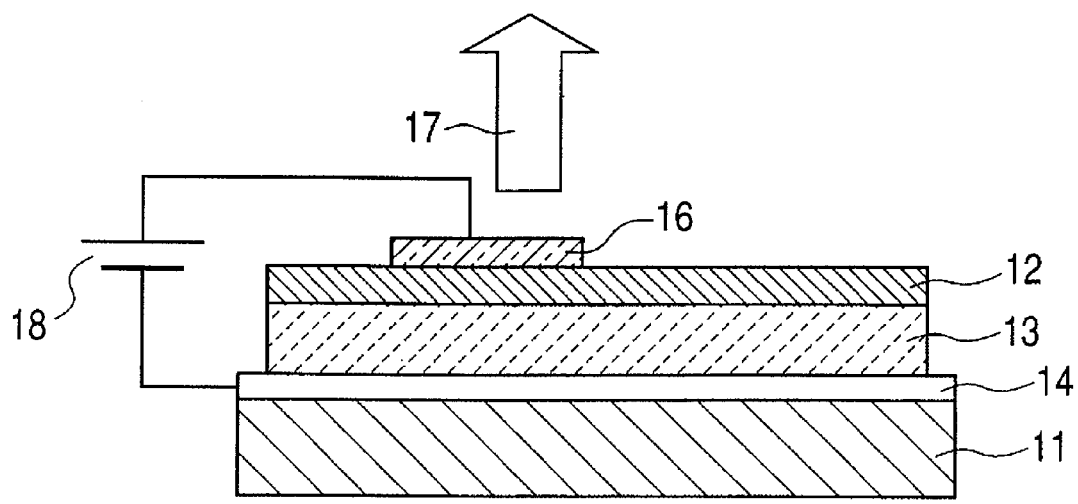
FIG. 2 is a schematic cross sectional view illustrating a light emitting device to which the light emitting film according to the embodiment of the present invention is applied.

The light emitting film according to the present invention can be applied to a light emitting device. For example, as illustrated in FIG. 2, a transparent electrode 16 located on the compound semiconductor side is connected with a positive electrode of a direct current power supply 18. A lower electrode 14 located on the light emitting material side is connected with a negative electrode of the direct current power supply 18. Therefore, a direct current driven light emitting device for emitting light is obtained. When a transparent substrate is used and a transparent electrode is used as the lower electrode 14, the emitted light can be extracted through the substrate.

Next, an embodiment of a method of manufacturing the compound semiconductor film and the light emitting film, according to the present invention will be described.

A film made of a light emitting material is formed on a substrate. A film made of a compound semiconductor is then formed on the light emitting material film. Thus, the light emitting film according to the present invention is obtained. Examples of a method of forming the light emitting material film and the compound semiconductor film include a multi-source evaporation method, a sulfuration method, a solid phase growing method, an organic metal chemical vapor phase transporting method, a vapor phase growing method, a sputtering method, and a laser ablation method. The multi-source evaporation method is effective in view of composition controllability. The sputtering method is effective in view of convenience.

When the compound semiconductor film is to be formed on a target base, a sulfide material may be supplied as a raw material of the compound semiconductor film. A part or all of the raw material can be supplied simultaneously with a metal material. When a laminated film made of the metal material or a laminated film made of the sulfide material and the metal material is formed and then heat treatment is performed in a hydrogen sulfide atmosphere, the laminated film can be sulfurated. In any case, the substrate temperature or the heat treatment temperature is set to 400° C. or higher and lower than 600° C. and the compound semiconductor film is crystallized at this manufacturing temperature, thereby obtaining a compound film exhibiting p-type conductivity. When the manufacturing temperature is lower than 400° C., the crystallization of the compound film is insufficient, so it is difficult to obtain desirable p-type conductivity. When the manufacturing temperature is equal to or higher than 600° C., it is significantly difficult to incorporate an element such as Zn or S into the compound film or it is liable to lose the element from the compound film, with the result that it is difficult to obtain a compound film having a desirable composition. In addition to this, the flatness of the surface of the compound film deteriorates, so it is difficult to laminate a film on the compound film. Therefore, the manufacturing temperature is desirably within the range described above. When the compound film is to be deposited, the following specific process is particularly performed using a vacuum evaporation apparatus. Using Cu and a zinc sulfide compound material containing at least one of Ge and Si which belong to Group IV as deposition sources, multi-source evaporation is performed in a hydrogen sulfide atmosphere. Thus, an excellent compound film is obtained.

The identification of the material composition of the compound film can be performed by X-ray fluorescence measurement, energy dispersive spectroscopy, or high-frequency inductive coupling plasma light emission spectroscopy. The crystallinity of the phosphor laminated film can be examined by X-ray diffractometry using CuKα radiation. The band gap can be estimated based on the x-intercept in a plot graph in which the ordinate (y-axis) indicates light optical absorption coefficient obtained by light transmission measurement and the abscissa (x-axis) indicates light energy.

EXAMPLES

Hereinafter, the present invention will be further described with reference to Examples. However, the present invention is not limited to Examples described below.

Example 1

Example 1 is an example in which the compound semiconductor film according to the present invention is manufactured.

As illustrated in FIG. 3, a compound semiconductor film 12 was deposited on a substrate 11 made of quartz. To be specific, a film of $Cu_2ZnGeS_4$ was formed on the substrate 11 by a vacuum evaporation apparatus using Cu and ZnS containing Ge (Zn/Ge mol ratio=1) as material supply sources. At this time, the substrate temperature was held at 400° C. A hydrogen sulfide gas was supplied. The pressure was $2\times10^{-2}$ Pa. Film deposition rates were set to 23 nm/minute (Cu) and 95 nm/minute (ZnS containing Ge) The film thickness was 100 nm. The obtained compound semiconductor film was subjected to X-ray fluorescence composition analysis. As a result, the mol ratio between the respective elements Cu:Zn:Ge:S was 2.4:1.5:1.0:4.3.

The conductivity of the obtained compound semiconductor film was measured with a hole measurement apparatus. As a result, p-type conductivity ($6.9\times10^{-3}$ ohm·cm, 1.6 cm$^2$/V·s$^{-1}$, and $+3.4\times10^{20}$ cm$^{-3}$) was exhibited. X-ray diffractometry using CuKα radiation was performed. As a result, 2θ=28.8°, 48.6°, and 52.6° were obtained as main peaks and thus it was found that many wurtz-stannite structures were produced. The band gap can be estimated to be Eg=2.1 eV based on the x-intercept in a plot graph in which the ordinate (y-axis) indicates light optical absorption coefficient obtained by light transmission measurement and the abscissa (x-axis) indicates light energy.

Of compounds represented by the $Cu_2$—Zn—IV—$S_4$ type, many compounds with the wurtz-stannite structure have an Eg value larger than an Eg value of the compounds with a stannite structure. Therefore, when the compound film includes many wurtz-stannite structures, the compound film having the band gap in the visible light region can be obtained.

Comparative Example

Hereinafter, Comparative Example to Example 1 in which the compound semiconductor film according to the present invention is manufactured will be described.

As illustrated in FIG. 3, a compound semiconductor film 12 was deposited on a substrate 11 made of quartz. To be specific, a film of $Cu_2ZnSnS_4$ was formed on the substrate 11 by a vacuum evaporation apparatus using Cu and ZnS containing Sn (Zn/Sn mol ratio=1) as material supply sources. At this time, the substrate temperature was held at 200° C. A hydrogen sulfide gas was supplied. The pressure was $2\times10^{-2}$ Pa. The film deposition rates were set to 22 nm/minute (Cu) and 55 nm/minute (ZnS containing Sn). The film thickness was 200 nm. The obtained compound semiconductor film was subjected to X-ray fluorescence composition analysis. As a result, the mol ratio between the respective elements Cu:Zn:Sn:S was 1.6:1.0:1.1:1.6.

The obtained compound semiconductor film was subjected to heat treatment at a temperature of 500° C. for 30 minutes while the hydrogen sulfide gas is being supplied at a pressure of $5 \times 10^{-2}$ Pa. Then, the conductivity of the compound semiconductor film was measured with a hole measurement apparatus. As a result, p-type conductivity (4.0 ohm·cm, 0.94 cm$^2$/V·s$^{-1}$, and +1.7×10$^{18}$ cm$^{-3}$) was exhibited. X-ray diffractometry using CuKα radiation was performed. As a result, 2θ=28.5°, 47.5°, and 56.3° were obtained as main peaks and thus it was found that many stannite structures were produced. The band gap can be estimated to be Eg=1.45 eV based on an x-intercept in a plot graph in which the ordinate (y-axis) indicates light optical absorption coefficient obtained by light transmission measurement and the abscissa (x-axis) indicates light energy.

When Comparative Example described above was compared with Example 1, in Example 1, it is apparent that the compound semiconductor film which exhibits the excellent p-type conductivity in the case of the low manufacturing temperature and has the band gap in the visible light region could be obtained.

Example 2

Example 2 is a first example in which a light emitting film using the compound semiconductor film according to the present invention is manufactured.

As illustrated in FIG. 1, a light emitting material 13 was deposited on a substrate 11 made of quartz. To be specific, a film of ZnS:Cu,Ga was formed on the substrate 11 by a vacuum evaporation apparatus using Cu and ZnS containing Ge (Ga/Zn=0.1 mol %) as material supply sources. At this time, the substrate temperature was held at 600° C. A hydrogen sulfide gas was supplied. The pressure was 1×10$^{-3}$ Pa. The film deposition rates were set to 20 nm/minute (Cu) and 600 nm/minute (ZnS containing Ga). The film thickness was 400 nm.

A compound semiconductor film 12 was formed on the obtained film of the light emitting material 13. To be specific, a film of Cu$_2$ZnGe$_x$Si$_{1-x}$S$_4$ was formed on the film of the light emitting material 13 by a vacuum evaporation apparatus using Cu and ZnS containing Ge and Si (mol ratio Zn:Ge:Si=1:0.6:0.4) as material supply sources. At this time, the substrate temperature was held at 500° C. The hydrogen sulfide gas was supplied. The pressure was 2×10$^{-2}$ Pa. The film deposition rates were set to 21 nm/minute (Cu) and 84 nm/minute (ZnS containing Ge and Si). The film thickness was 100 nm.

The light emitting film is irradiated with an excitation light 15 having a wavelength of 312 nm with an ultraviolet lamp through the substrate 11 made of quartz. As a result, a green emission light 17 having a center wavelength of 530 nm was obtained through the compound semiconductor film 12.

As described above, in this example, it is possible to obtain the light emitting film in which the light emitting material and the compound semiconductor film are successively laminated on the substrate. Thus, sulfur deficiency or oxidation can be prevented, so the number of defects included in the light emitting material becomes smaller. The injection level of carriers is improved, with the result that a light emitting film capable of emitting higher-intensity light can be obtained.

Example 3

Example 3 is a second example in which a light emitting film using the compound semiconductor film according to the present invention is manufactured.

As illustrated in FIG. 1, a light emitting material 13 was deposited on a substrate 11 made of GaP (100). To be specific, a film of ZnS:Ag,Al was formed on the substrate 11 by a vacuum evaporation apparatus using Ag and ZnS containing Al (Al/Zn=0.1 mol %) as material supply sources. At this time, the substrate temperature was held at 750° C. A hydrogen sulfide gas was supplied. The pressure was 2×10$^{-3}$ Pa. The film deposition rates were set to 10 nm/minute (Ag) and 700 nm/minute (ZnS containing Al). The film thickness was 400 nm.

A compound semiconductor film 12 was formed on the obtained film of the light emitting material 13. To be specific, a film of Cu$_2$ZnGe$_x$Si$_{1-x}$S$_4$ was formed on the film of the light emitting material 13 by a vacuum evaporation apparatus using Cu and ZnS containing Ge and Si (mol ratio Zn:Ge:Si=1:0.2:0.8) as material supply sources. At this time, the substrate temperature was held at 580° C. The hydrogen sulfide gas was supplied. The pressure was 5×10$^{-2}$ Pa. The film deposition rates were set to 21 nm/minute (Cu) and 84 nm/minute (ZnS containing Ge and Si). The film thickness was 100 nm.

The light emitting film is irradiated with an excitation light 15 having a wavelength of 312 nm with an ultraviolet lamp through the compound semiconductor film 12. As a result, a blue emission light 17 having a center wavelength of 480 nm was obtained through the compound semiconductor film 12.

As described above, in this example, it is possible to obtain the light emitting film in which the light emitting material and the compound semiconductor film in which a larger amount of Si is added to Cu$_2$ZnGeS$_4$ are successively laminated on the substrate. Therefore, the compound semiconductor film whose band gap is larger is obtained. Thus, emission light having a shorter wavelength, which is emitted from the light emitting material can be efficiently extracted to the outside without being absorbed in the compound semiconductor film, with the result that a light emitting film capable of emitting higher-intensity light can be obtained.

Example 4

Example 4 is an example in which a light emitting device using the light emitting film according to the present invention is manufactured.

As illustrated in FIG. 2, an Mo film whose film thickness is 200 nm was formed as a lower electrode 14 on a quartz substrate which is a substrate 11 by a sputtering apparatus.

Then, ZnS:Cu,Cl is produced as a light emitting material 13 by a vacuum evaporation apparatus using Cu and ZnS containing Cl (Cl/Zn=0.1 mol %) as material supply sources. At this time, the substrate temperature was held at 600° C. A hydrogen sulfide gas was supplied. The pressure was 1×10$^{-3}$ Pa. The film deposition rates were set to 20 nm/minute (Cu) and 600 nm/minute (ZnS containing Cl). The film of the light emitting material 13 was formed at a film thickness of 400 nm.

Then, Cu$_2$ZnGe$_x$Si$_{1-x}$S$_4$ was produced as a compound semiconductor film 12 by a vacuum evaporation apparatus using Cu and ZnS containing Ge and Si (mol ratio Zn:Ge:Si=1:0.2:0.8) as material supply sources. At this time, the substrate temperature was held at 580° C. The hydrogen sulfide gas was supplied. The pressure was 5×10$^{-2}$ Pa. The film deposition rates were set to 21 nm/minute (Cu) and 84 nm/minute (ZnS containing Ge and Si). The film of the compound semiconductor film 12 was formed at a film thickness of 100 nm.

In addition to the light emitting device according to this example, a Cu$_2$ZnGe$_x$Si$_{1-x}$S$_4$ film was manufactured on a silicon substrate and subjected to X-ray diffractometry using CuKα radiation. As a result, 2θ=27.7°, 31.4°, and 49.2° were obtained as main peaks and thus it was found that many wurtz-stannite structures were produced. The obtained film had a particularly large peak intensity at 2θ=27.7° and thus is a film oriented mainly in the (210) direction.

An ITO film whose film thickness was 400 nm was formed as a transparent electrode 16 on the obtained compound semiconductor film 12 by a sputtering apparatus.

When a voltage from a direct current power supply 18 is applied between the lower electrode 14 and the transparent electrode 16 in the manufactured light emitting device, a cyan emission light whose intensity gradually increased from the vicinity of 20 V was obtained.

For comparison with the above light emitting device, as illustrated in FIG. 4, a light emitting device in which the compound semiconductor film 12 was not formed was separately manufactured and a voltage from the direct current power supply 18 was applied between the lower electrode 14 and the transparent electrode 16. As a result, the following was found. That is, emission light was not obtained in the vicinity of 20 V. When the voltage was further increased, the light emitting device was electrically broken down, so stable light emission was not realized.

As described above, according to this example, it is possible to obtain the high-intensity light emitting device in which the light emitting film and the electrode films are laminated on the substrate.

The present invention can be used for a direct current driven light emitting device, especially for an LED and an EL device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-154035, filed Jun. 11, 2007, which is hereby incorporated by reference herein in its entirety.

What is claimed is:

1. A compound semiconductor film having a composition represented by a $Cu_2$—Zn—IV—$S_4$ type, wherein the IV is at least one of Ge and Si, and wherein the compound semiconductor film contains Sn and has a band gap equal to or larger than 1.5 eV.

2. A compound semiconductor film according to claim 1, wherein the compound semiconductor film exhibits p-type conductivity.

3. A compound semiconductor film according to claim 1, wherein the compound semiconductor film mainly has a wurtz-stannite structure.

4. A light emitting film comprising at least a light emitting material and the compound semiconductor film according to claim 1 laminated on a substrate in the stated order.

5. A light emitting film according to claim 4, wherein the light emitting material is a donor-acceptor pair light emitting material.

6. A light emitting film according to claim 5, wherein the donor-acceptor pair light emitting material is comprised of a host material of a zinc sulfide compound and an additional element comprised of an acceptor and a donor.

7. A light emitting film according to claim 6, wherein, for the additional element, the acceptor comprises at least one element selected from the group consisting of Au, Ag, Cu, and N, and the donor comprises at least one element selected from the group consisting of Al, Ga, In, F, Cl, Br, and I.

8. A light emitting device comprising at least the light emitting film according to claim 4 and an electrode film laminated on the substrate.

* * * * *